(12) United States Patent
Ushiyama et al.

(10) Patent No.: US 10,141,482 B2
(45) Date of Patent: Nov. 27, 2018

(54) SEMICONDUCTOR LIGHT EMITTING DEVICE

(71) Applicant: ALPAD Corporation, Tokyo (JP)

(72) Inventors: Naoya Ushiyama, Shinagawa Tokyo (JP); Masahiro Ogushi, Nonoichi Ishikawa (JP); Kazuhiro Tamura, Nonoichi Ishikawa (JP); Hidenori Egoshi, Nonoichi Ishikawa (JP); Toshihiro Kuroki, Kokubunji Tokyo (JP)

(73) Assignee: ALPAD CORPORATION, Tokyo (JP)

( * ) Notice: Subject to any disclaimer, the term of this patent is extended or adjusted under 35 U.S.C. 154(b) by 0 days.

(21) Appl. No.: 15/060,550

(22) Filed: Mar. 3, 2016

(65) Prior Publication Data

US 2017/0040499 A1 Feb. 9, 2017

(30) Foreign Application Priority Data

Aug. 3, 2015 (JP) .................................. 2015-153665
Dec. 4, 2015 (JP) .................................. 2015-237219

(51) Int. Cl.
*H01L 33/50* (2010.01)
*H01L 33/56* (2010.01)
(Continued)

(52) U.S. Cl.
CPC ............ *H01L 33/502* (2013.01); *H01L 33/56* (2013.01); *H01L 33/58* (2013.01); *H01L 33/60* (2013.01); *H01L 33/641* (2013.01); *H01L 2224/48091* (2013.01); *H01L 2224/48247* (2013.01); *H01L 2224/48257* (2013.01); *H01L 2224/73265* (2013.01); *H01L 2224/83192* (2013.01); *H01L 2224/8592* (2013.01);
(Continued)

(58) Field of Classification Search
CPC .......................... H01L 33/502; H01L 33/641
USPC .......................................................... 257/98
See application file for complete search history.

(56) References Cited

U.S. PATENT DOCUMENTS 6,809,342 B2 10/2004 Harada
7,049,159 B2 5/2006 Lowery
(Continued)

FOREIGN PATENT DOCUMENTS

CN        1577909 A     2/2005
CN      104064635 A     9/2014
(Continued)

OTHER PUBLICATIONS

Taiwanese Office Action dated Sep. 2, 2016, filed in Taiwanese counterpart Patent Application No. 105107256, 6 pages (with English translation).
(Continued)

*Primary Examiner* — Bo Fan
(74) *Attorney, Agent, or Firm* — Patterson & Sheridan, LLP

(57) ABSTRACT

A semiconductor light emitting device includes a light emitting chip that includes a semiconductor layer at a first surface. A transparent film is provided on the semiconductor layer and forms an interface therewith. A phosphor resin layer, including a resin and a phosphor, is provided on the transparent film. A refractive index of the transparent film is greater than a refractive index of the semiconductor layer.

18 Claims, 18 Drawing Sheets

(51) Int. Cl.
  *H01L 33/58* (2010.01)
  *H01L 33/60* (2010.01)
  *H01L 33/64* (2010.01)
(52) U.S. Cl.
  CPC ............ *H01L 2224/92247* (2013.01); *H01L 2924/181* (2013.01); *H01L 2933/005* (2013.01); *H01L 2933/0041* (2013.01); *H01L 2933/0058* (2013.01); *H01L 2933/0075* (2013.01)

(56) References Cited

U.S. PATENT DOCUMENTS

| | | | |
|---|---|---|---|
| 8,159,131 | B2 | 4/2012 | Helbing |
| 2006/0012299 | A1 | 1/2006 | Suehiro et al. |
| 2006/0060877 | A1 | 3/2006 | Edmond et al. |
| 2012/0049116 | A1* | 3/2012 | Lyons ............... H01L 33/502 252/301.4 P |
| 2012/0261699 | A1 | 10/2012 | Ooyabu et al. |
| 2013/0200785 | A1 | 8/2013 | Yano et al. |
| 2014/0361324 | A1 | 12/2014 | Ushiyama et al. |
| 2015/0069436 | A1 | 3/2015 | Akimoto et al. |

FOREIGN PATENT DOCUMENTS

| | | |
|---|---|---|
| JP | 2007194525 A | 8/2007 |
| JP | 2011035198 A | 2/2011 |
| JP | 2012502449 A | 1/2012 |
| JP | 4953846 B2 | 6/2012 |
| JP | 2013239712 A | 11/2013 |
| JP | 2014241341 A | 12/2014 |
| TW | 200623464 A | 7/2006 |
| TW | 2011-45624 | 12/2011 |
| TW | 201220552 A | 5/2012 |
| TW | 201242113 A | 10/2012 |
| TW | 2014-43144 | 11/2014 |
| TW | 201511351 A | 3/2015 |
| WO | 2011016433 A1 | 2/2011 |

OTHER PUBLICATIONS

Chinese Office Action dated Apr. 19, 2018, filed in Chinese counterpart Application No. 201610140817.8, 6 pages.

* cited by examiner

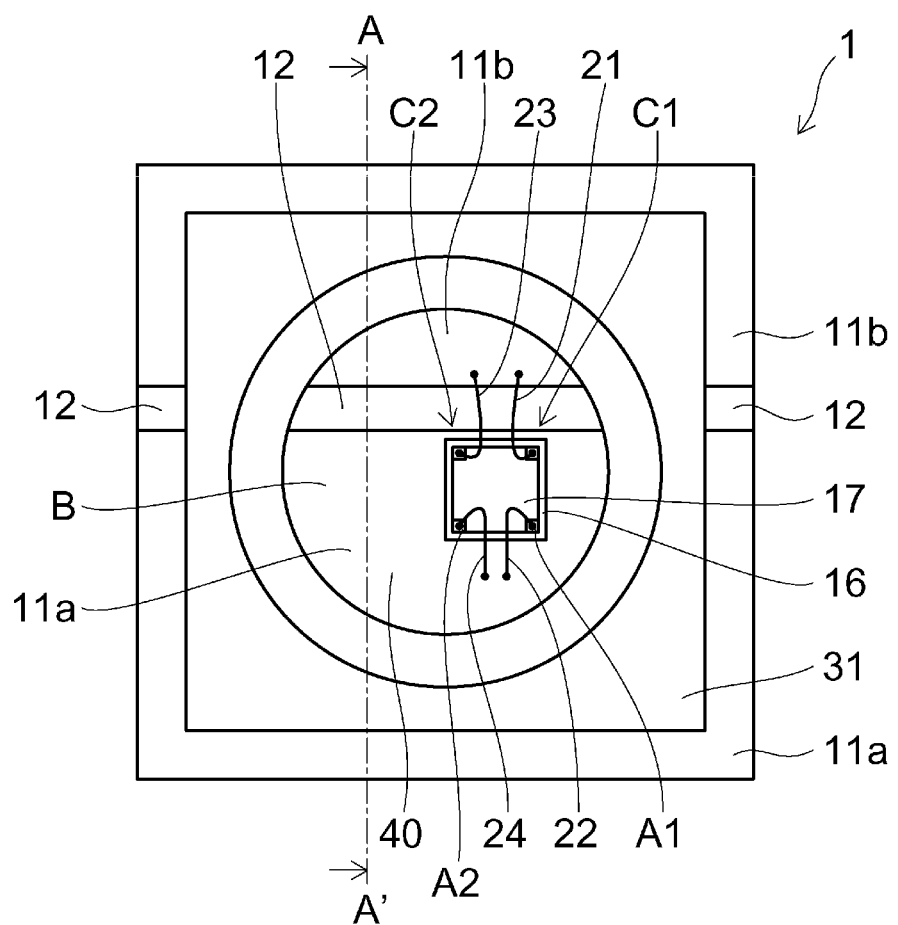

SEMICONDUCTOR LIGHT EMITTING DEVICE

CROSS-REFERENCE TO RELATED APPLICATIONS

This application is based upon and claims the benefit of priority from Japanese Patent Applications No. 2015-237219, filed Dec. 4, 2015, and No. 2015-153665, filed Aug. 3, 2015; the entire contents of each are incorporated herein by reference.

FIELD

Embodiments described herein relate to a semiconductor light emitting device.

BACKGROUND

A semiconductor light emitting device may include a semiconductor light emitting element disposed on a flat lead frame portion with a phosphor layer disposed on the semiconductor light emitting element. The semiconductor light emitting element emits light to the outside via the phosphor layer. A portion of the light from the light emitting element is reflected at an interface between the phosphor layer and the outside (e.g., an outer surface of the phosphor layer) back towards the semiconductor light emitting element and the lead frame. The semiconductor light emitting element and the lead frame will generally have poor optical reflectance and will therefore absorb a large part of the reflected light incident thereon. It is preferable for output efficiency that light emitted from the semiconductor light emitting element is supplied to the outside of the device rather than absorbed internally.

DESCRIPTION OF THE DRAWINGS

FIG. 2A is a plan view schematically illustrating the semiconductor light emitting device according to the first embodiment.

DETAILED DESCRIPTION

Figure 1:
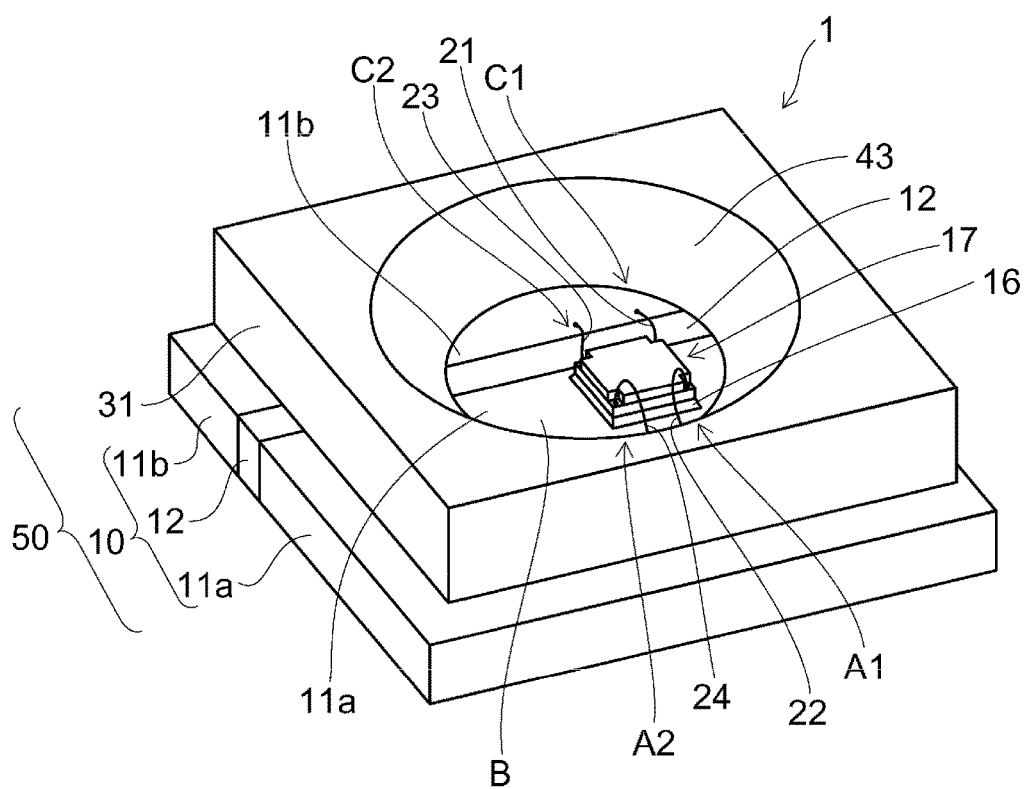
FIG. 1 is a perspective view illustrating a semiconductor light emitting device according to a first embodiment.

In general, according to one embodiment, a semiconductor light emitting device includes a light emitting semiconductor chip that includes a semiconductor layer at a first surface of the light emitting chip. A transparent film is provided on the semiconductor layer and forms an interface therewith. A phosphor resin layer (including a resin and a phosphor) is provided on the transparent film. A refractive index of the transparent film is greater (higher) than a refractive index of the semiconductor layer.

In another embodiment, a light emitting device includes a light emitting laminated body comprising a plurality of layers stacked one on the other along a stacking direction (a first direction orthogonal to a layer plane) of the light emitting laminated body. A light emitting layer is included in the plurality of layers. A first terminal is disposed on a first layer in the plurality of layers. The first layer is below the light emitting layer in the stacking direction. A second terminal is disposed on a second layer in the plurality of layers. The second layer is above the light emitting layer along the first direction. A transparent film is disposed on an upper surface of an uppermost one of the layers in the plurality of layers. A refractive index of the transparent film is greater than a refractive index of the uppermost one of the layers. In some embodiments, the second layer may be the uppermost one of the layers in the plurality of layers.

Hereinafter, the embodiments will be described with reference to the drawings.

Note that, the drawings are schematic or conceptual, and thus a relationship between a thickness and width of the various portions, and a size ratio between portions are not necessarily the same as those in reality. In addition, even when the same parts are illustrated in different drawings, the dimensions and ratios may be differently expressed from each other depending on the drawing.

It should be noted that, in the present specification and the drawings, the same elements as those described above with reference to earlier drawings are given the same reference numerals, and a detailed description thereof will be omitted as appropriate.

First Embodiment

FIG. 1 is a perspective view illustrating a semiconductor light emitting device according to a first embodiment.

As illustrated in FIG. 1, in the semiconductor light emitting device 1, a flat frame (lead frame) 10 is provided. In the frame 10, two electrodes 11a and 11b, which are separated from each other, are provided and an insulating member (insulating material) 12 is provided between the electrodes 11a and 11b. The insulating member 12 is formed of, for example, a resin material and provides electrical separation between the electrodes 11a and 11b. An upper surface of the electrode 11a, an upper surface of the insulating member 12, and an upper surface of the electrode 11b are in a same plane. In addition, when seen from above (see e.g., FIG. 2A), that is, from a direction perpendicular to a planar surface, the electrode 11a is larger than the electrode 11b. A chip 17 is mounted on an end portion of the electrode 11a nearer the insulating member 12 side of electrode 11a. That is, the chip 17 is disposed on the upper surface of electrode 11a near an outer edge of electrode 11a facing electrode 11b across the insulating member 12.

For example, an enclosure 31 formed of a white resin (a resin reflecting light rather than absorbing light) is provided on the frame 10. A structure including the frame 10 and the enclosure 31 is referred to as a case body 50. The enclosure 31 has a shape in which a center portion of an otherwise rectangular parallelepiped is hollowed such that an opening in the enclosure 31 has a width/diameter that becomes gradually smaller with distance from an upper surface towards a bottom surface of the enclosure 31. As depicted in FIG. 1, the interior surface of the enclosure 31 forms a "bowl" shape. That is, the interior surface of the enclosure 31 is inclined with respect to the bottom surface of the enclosure 31. On the upper surface of the frame 10, an area which is surrounded by the enclosure 31 but exposed by the opening therein is referred to as an area B.

FIG. 2A is a plan view schematically illustrating the semiconductor light emitting device according to the first embodiment.

As illustrated in FIG. 2A, a cathode electrode C1, an anode electrode A1, a cathode electrode C2, and an anode electrode A2 of an LED chip 13 are provided at four corners of the chip 17. The cathode electrode C1 and the electrode 11b are connected to each other via a wire 21. The anode electrode A1 and the electrode 11a are connected to each other via a wire 22. The cathode electrode C2 and the electrode 11b are connected to each other via a wire 23. The anode electrode A2 and the electrode 11a are connected to each other via a wire 24. The wires 21 to 24 are formed of, for example, gold (Au).

Figure 2B:
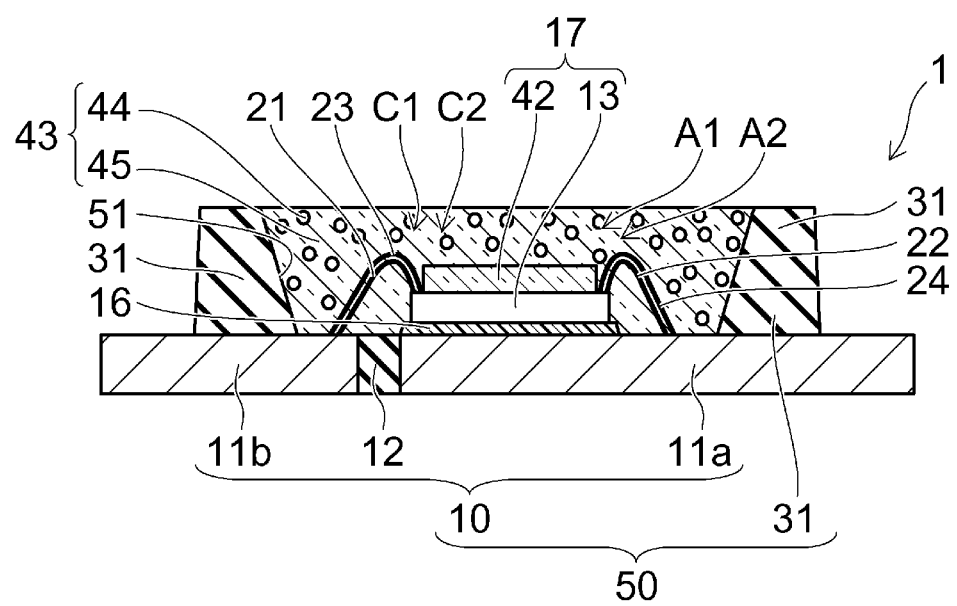
FIG. 2B is a perspective view schematically illustrating the semiconductor light emitting device according to the first embodiment.

FIG. 2B is perspective view schematically illustrating the semiconductor light emitting device according to the first embodiment.

As illustrated in FIGS. 2A and 2B, the case body 50 includes the enclosure 31, which surrounds the area B, and a recessed portion 51, which here refers to the opening with inclined surface(s) formed in enclosure 31. In the recessed portion 51, a phosphor resin layer 43 is provided. The phosphor resin layer 43 is formed by mixing a phosphor 44 into a resin 45. The resin 45 is, for example, a phenyl-based silicone resin. The phosphor resin layer 43 thus includes a resin 45 and a phosphor 44.

The chip 17 is provided on area B of the case body 50, more specifically here on an upper surface of electrode 11a. The chip 17 includes a LED chip 13 and a transparent film 42 which is provided on the LED chip 13. The chip 17 is adhered onto the electrode 11a via a mounting material 16. The transparent film 42 is preferably a transparent material having high thermal conductivity and a high refractive index. The transparent film 42 is formed of, for example, silicon carbide (SiC).

In the semiconductor light emitting device 1, the chip 17 is an LED chip 13 including a transparent film 17 formed thereon. The chip 17 may be obtained by forming the transparent film 42 on the LED chip 13 after forming the LED chip 13. In this regard, a method of forming the chip 17 which is used in the semiconductor light emitting device of the exemplary embodiment will be described.

FIGS. 3A to 3D are views schematically illustrating a method of forming the chip of the semiconductor light emitting device of the first embodiment.

Figure 3A:
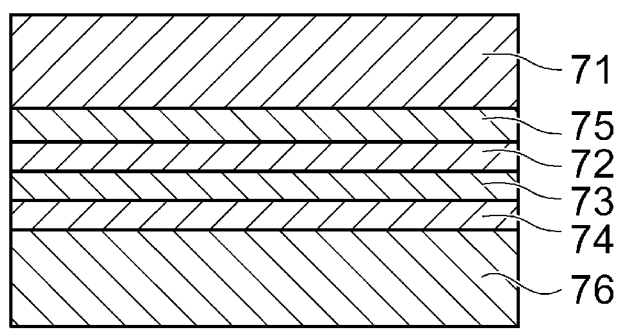
FIGS. 3A to 3D are views schematically illustrating a method of forming a chip of the semiconductor light emitting device according to the first embodiment.

As illustrated in FIG. 3A, an n-type semiconductor layer 74 and a p-type semiconductor layer 72 are formed by epitaxial growth on growth substrate 76 through, for example, a metal organic chemical vapor deposition (MOCVD) method. A light emitting layer 73 is formed between the n-type semiconductor layer 74 and the p-type semiconductor layer 72. For example, a metal layer 75 is formed on the p-type semiconductor layer 72 through a physical vapor deposition (PVD) method for example. A silicon substrate 71 is bonded onto the metal layer 75.

Figure 3B:
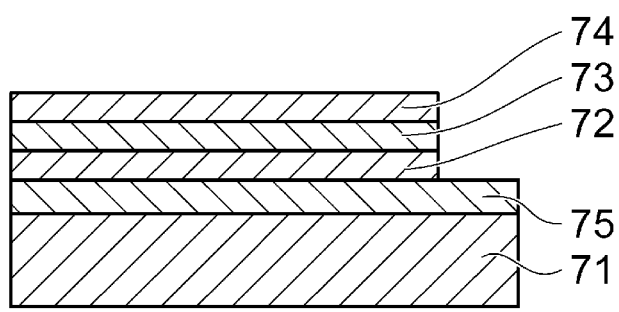

As illustrated in FIG. 3B, the growth substrate 76 is removed through wet etching. A portion of each of the n-type semiconductor layer 74, the light emitting layer 73, and the p-type semiconductor layer 72 is removed though etching as well. As a result, a portion of the surface of the metal layer 75 is exposed. For the sake of convenience of description, FIG. 3B is an inverted view as compared to FIG. 3A (that is, the layer stack is re-oriented in the depiction such that the upper layer in FIG. 3A is the lower layer in FIG. 3B).

Figure 3C:
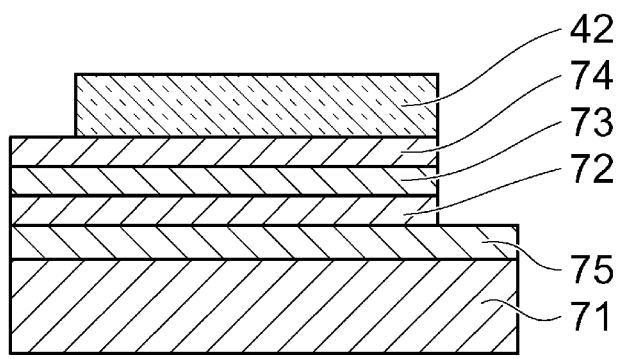

As illustrated in FIG. 3C, the transparent film 42 is formed by coating the n-type semiconductor layer 74 with silicon carbide. During this coating process, those portions of the n-type semiconductor layer 74 and the metal layer 75, on which the cathode electrode C1, the cathode electrode C2, the anode electrode A1, and the anode electrode A2 are to be arranged, are masked such that the transparent film 42 is not formed on those portions.

Note that, in some embodiments, a transparent film 42 can be pre-configured to have a shape and size corresponding to the LED chip 13, then disposed or mounted on the n-type semiconductor layer 74 instead of forming the transparent film 42 on the n-type semiconductor layer 74 by coating the n-type semiconductor layer 74 with silicon carbide.

Figure 3D:
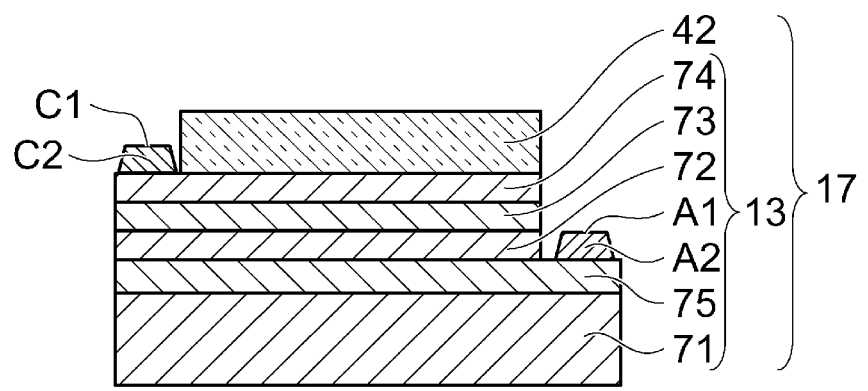

As illustrated in FIG. 3D, the cathode electrode C1 and the cathode electrode C2 are formed on the n-type semiconductor layer 74. The anode electrodes A1 and A2 are formed on the exposed metal layer 75, and the chip 17 is formed.

Figure 4A:
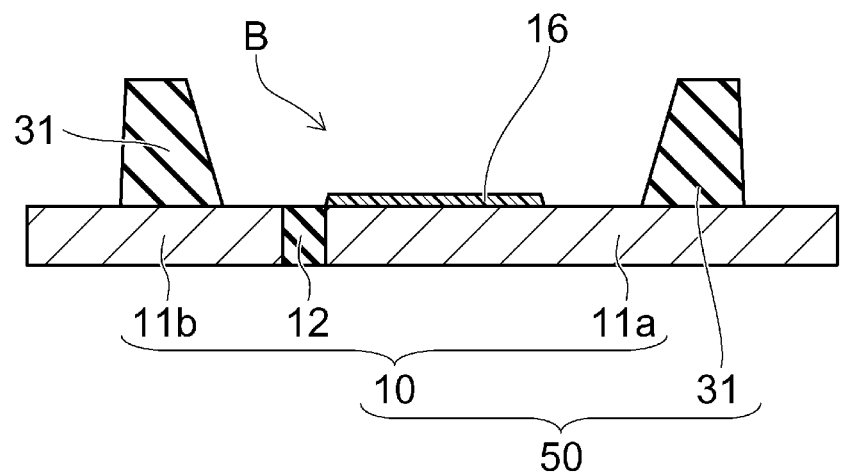
FIGS. 4A to 4C are perspective views schematically illustrating a method of manufacturing the semiconductor light emitting device according to the first embodiment.
Figure 4B:
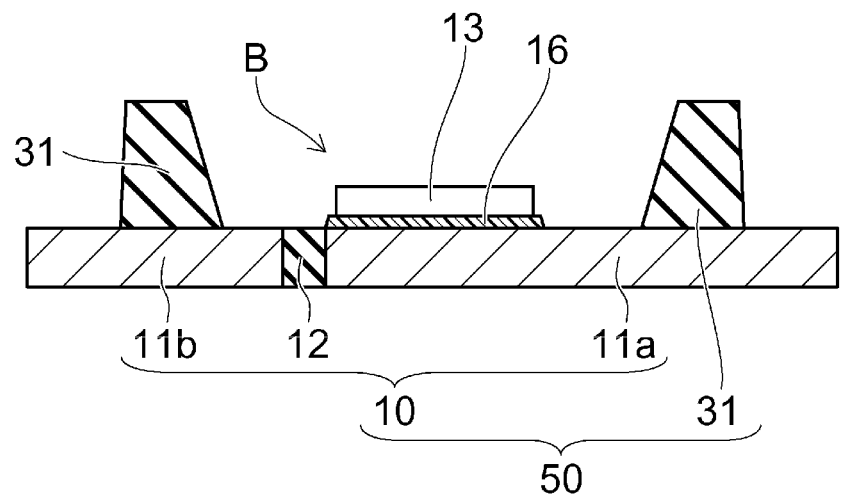
Figure 4C:
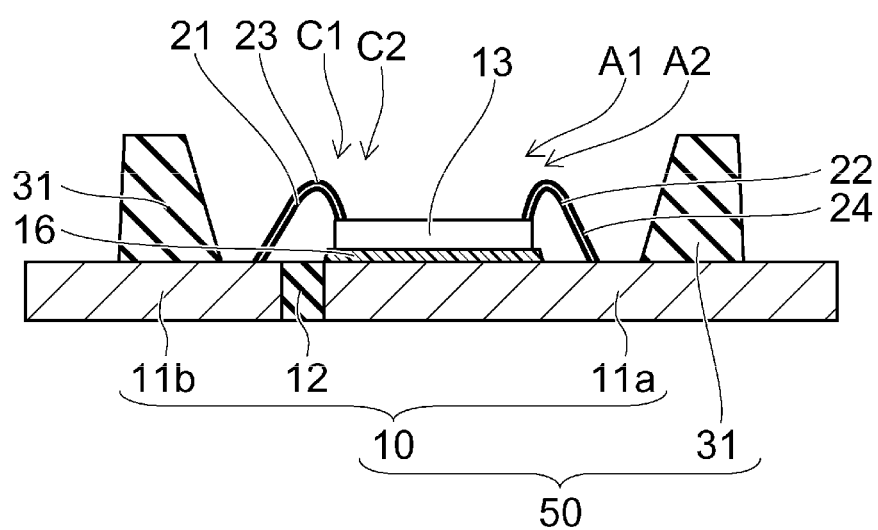

FIGS. 4A to 4C are perspective views schematically illustrating a method of manufacturing the semiconductor light emitting device of the exemplary embodiment.

As illustrated in FIG. 4A, a portion of the area B is coated with a mounting material 16. The mounting material 16 is an adhesive, for example. In some embodiments, the adhesive may be a solder-type material, a paste, a glue, and/or tape or the like.

As illustrated in FIG. 4B, the LED chip 13 is mounted on the mounting material 16. By using the mounting material 16, the LED chip 13 is adhered and fixed to the case body 50.

As illustrated in FIG. 4C, the cathode electrode C1 and the electrode 11b are connected to each other via the wire 21 through the wire bonding. The anode electrode A1 and the electrode 11a are connected to each other via the wire 22. The cathode electrode C2 and the electrode 11b are connected to each other via the wire 23. The anode electrode A2 and the electrode 11a are connected to each other via the wire 24.

As illustrated in FIG. 2B, phosphor resin layer 43 is formed in such a manner that the recessed portion 51 of the case body 50 is filled with a phosphor material which is obtained by mixing the phosphor 44 into the resin 45. The resin 45 is, for example, a phenyl-based silicone resin. The entire recessed portion 51 of the case body 50 is filled with the phosphor material.

In the semiconductor light emitting device 1 of the first embodiment, the chip 17 in which the transparent film 42 is already formed on the LED chip 13 is employed. The transparent film 42 is formed of, for example, silicon carbide. A refractive index of silicon carbide is higher than a refractive index of a material forming the LED chip 13. If light transmits from a material having a low refractive index into a material having a high refractive index, an emission angle at an interface between these materials becomes less than an incident angle at interface, and such low-angle light is not easily reflected into an intended emission direction. In contrast, if the light transmits from material having a high refractive index into material having a low refractive index, the emission angle at the interface becomes larger than the incident angle at the interface, and this light is more easily reflected into the intended emission direction. Accordingly, when a material having a high refractive index, such as silicon carbide, is used as the transparent film 42, the light emitted from the LED chip 13 is less significantly (or not at all) internally reflected at the interface between the LED chip 13 and the transparent film 42. Likewise, the light internally reflected at the interface between the phosphor resin layer 43 and the outside (e.g., the device upper surface) will be more substantially reflected outwardly at the interface between the LED chip 13 and the transparent film 42. That is, any light produced by the LED chip 13 which initially transmits through the interface between the LED chip 13 and the transparent film 42 but is then internally reflected at the interface between the phosphor resin layer 43 and the outside to again be incident at the interface of the LED chip 13 and the transparent film (but now from a different travelling direction after downwardly reflection at the device's top surface), will be more likely to reflect (upwardly) and be emitted from the device.

As compared to a case where the transparent film 42 is not provided, the amount of the light which is emitted from the LED chip 13, but then returned to the LED chip 13 by various interfacial reflections can be decreased. Thusly, it is possible to increase the amount of the light which is emitted from the LED chip 13 and then subsequently emitted to the outside via the phosphor resin layer 43 by inclusion of the transparent film 42. As a result, it is possible to provide the semiconductor light emitting device with improved light extraction efficiency.

In the phosphor resin layer 43, blue light which can be emitted from the LED chip 13 can be converted into yellow light having a wavelength which is longer than that of the blue light. In this wavelength conversion, a loss of light occurs the portion of the light corresponding to the lost (absorbed) amount is converted into heat.

The thermal conductivity of the phosphor resin layer 43 is, for example, 0.200 W/mK (watt per meter per Kelvin). The thermal conductivity of silicon carbide forming the transparent film 42 is, for example, 100 W/mK. The thermal conductivity of the transparent film 42 is thus higher than that of the phosphor resin layer 43, and it is possible to dissipate heat that is generated in the phosphor resin layer 43 to the LED chip 13 via the transparent film 42.

In some embodiments, the transparent film 42 may be formed of aluminum oxide ($Al_2O_3$). The thermal conductivity of the aluminum oxide is, for example, 30 W/mK, which is still larger than that of the phosphor resin layer 43. Accordingly, it is possible to dissipate the heat which is generated in the phosphor resin layer 43 to the LED chip 13.

Comparative Example

Figure 5:
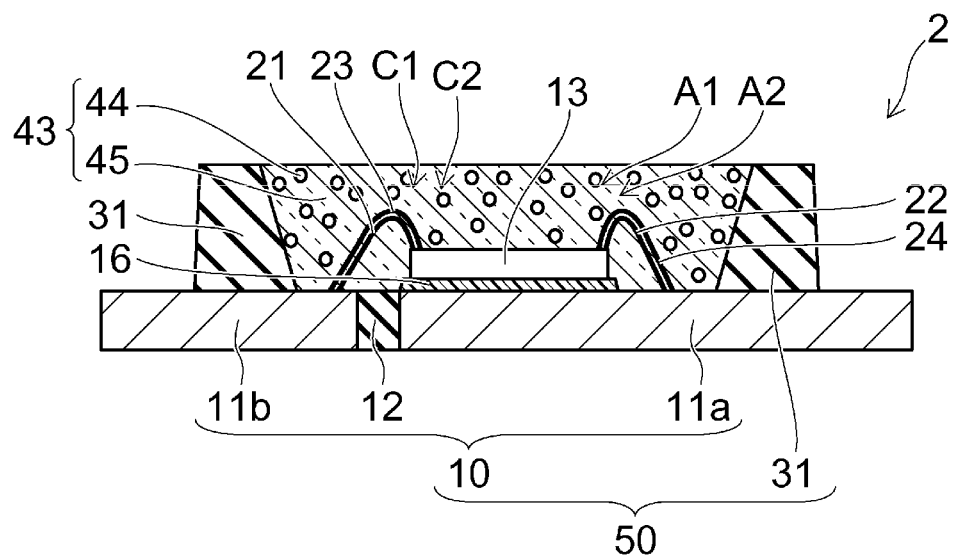
FIG. 5 is a perspective view schematically illustrating the semiconductor light emitting device according to a comparative example.

FIG. 5 is perspective view schematically illustrating the semiconductor light emitting device according to a comparative example As illustrated in FIG. 5, unlike the semiconductor light emitting device 1 (refer to FIG. 2B), the transparent film 42 is not provided on the LED chip 13 in a semiconductor light emitting device 2 according to the comparative example.

Since the transparent film 42, which has a high refractive index, is not provided on the LED chip 13, the light output from the LED chip 13 is more easily internally reflected at the interface between the LED chip 13 and the phosphor resin layer 43 as compared with the first embodiment. In addition, the light which is reflected at the interface between the phosphor resin layer 43 and the outside does not significantly get internally reflected at the interface between the LED chip 13 and the transparent film 42. As a result, the semiconductor light emitting device 2 exhibits lower light extraction efficiency.

In addition, since the transparent film 42, which has high thermal conductivity, is not provided on the LED chip 13 inside the phosphor resin layer 43, the heat generated due to the light loss at the time of light conversion is not easy to be dissipated to the LED chip 13 via the transparent film 42.

Second Embodiment

Figure 6:
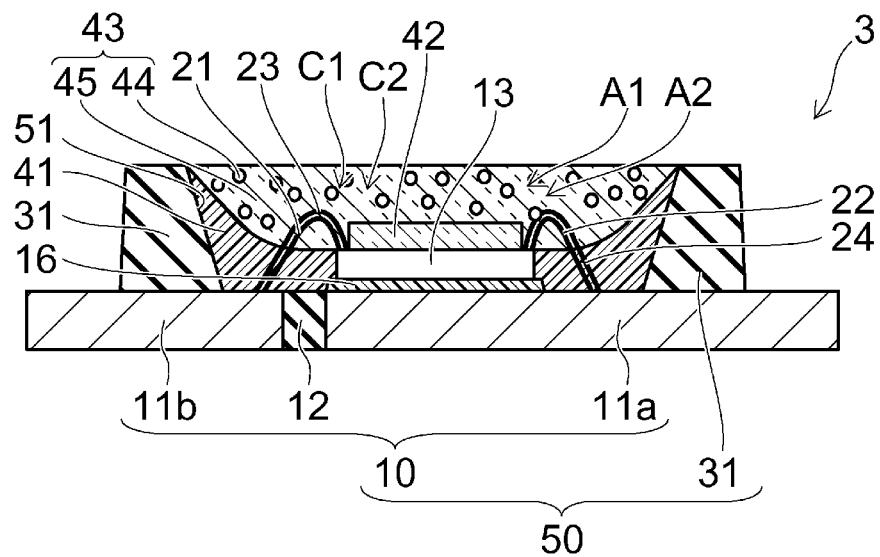
FIG. 6 is a perspective view schematically illustrating a semiconductor light emitting device according to a second embodiment.

FIG. 6 is perspective view schematically illustrating a semiconductor light emitting device of a second embodiment.

As illustrated in FIG. 6, unlike the semiconductor light emitting device 1 (refer to FIG. 2B), in a semiconductor light emitting device 3 of the second embodiment, a high reflectance layer 41 is provided below the phosphor resin layer 43. The high reflectance layer 41 is not provided on the upper surface of the LED chip 13 and the surface of the transparent film 42.

The high reflectance layer 41 is a layer for emitting the light, which is emitted from the LED chip 13 and then reflected on the interface between the phosphor resin layer 43 and the outside, to the outside by reflecting again.

Figure 7:
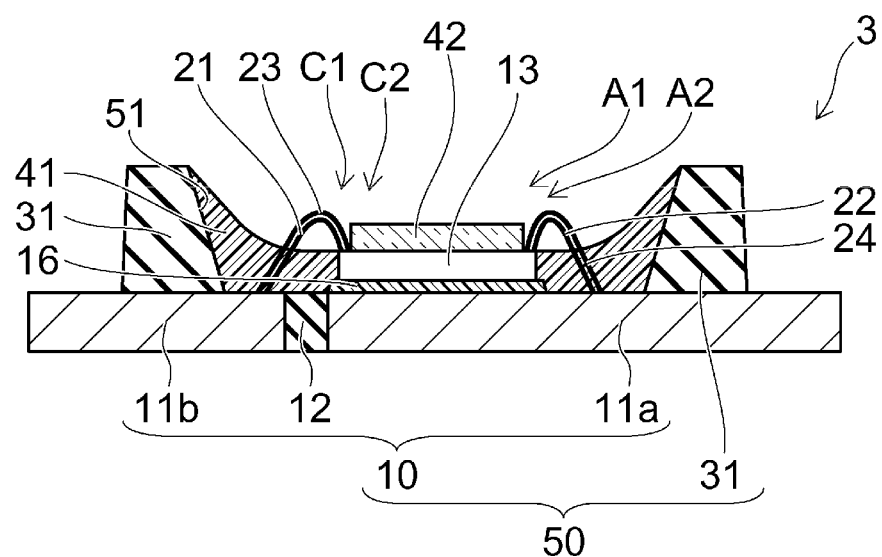
FIG. 7 is a perspective view schematically illustrating a method of manufacturing the semiconductor light emitting device according to the second embodiment.

FIG. 7 is perspective view schematically illustrating a method of manufacturing a semiconductor light emitting device 3 of the second embodiment.

The manufacturing method is the same as the manufacturing method (refer to FIG. 4C) of the semiconductor light emitting device 1 of the first embodiment until the wires 21 to 24 are formed using wire bonding.

As illustrated in FIG. 7, the high reflectance layer 41 is formed in such a manner that the inside of the recessed portion 51 is partially filled with a highly reflective material obtained by mixing a fine particle of titanium oxide (e.g., $TiO_2$) into the resin. Here, it is preferable that the inside of the recessed portion 51 is not completely filled with the highly reflective material to form high reflectance layer 41. For example, a lower portion of the recessed portion 51 is filled with a highly reflective material to a level that is below the level of the lower surface of the transparent film 42. As depicted in FIG. 7, some peripheral portions of the high reflectance layer 41 may be above the highest level of the transparent film 42.

As illustrated in FIG. 6, the phosphor resin layer 43 is formed in such a manner that the high reflectance layer 41 and the transparent film 42 are coated with the phosphor material obtained by mixing the phosphor 44 into the resin 45. The resin 45 is, for example, a phenyl-based silicone resin. The remaining space inside of the recessed portion 51 is completely filled with the phosphor material.

The effects of the exemplary embodiment will be described.

In the second embodiment, by incorporation of the high reflectance layer 41, it is possible to emit from the device at least some portion of the light which is internally reflected at the interface between the phosphor resin layer 43 and the outside by reflecting the internally reflected light again (off the high reflectance layer 41). As a result, the light extraction efficiency becomes higher than that in the first embodiment.

A configuration, a manufacturing method, and effects of the exemplary embodiment other than the above description are the same as those of the first embodiment.

Third Embodiment

Figure 8:
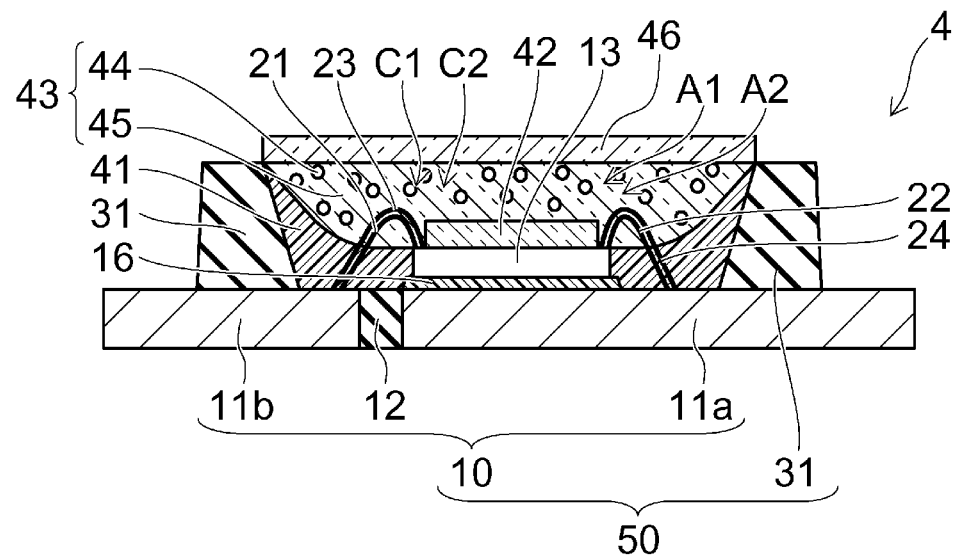
FIG. 8 is a perspective view schematically illustrating a semiconductor light emitting device according to a third embodiment.

FIG. 8 is perspective view schematically illustrating a semiconductor light emitting device of a third embodiment.

As illustrated in FIG. 8, in a semiconductor light emitting device 4 of the third embodiment, a high heat dissipation member 46 is provided on the phosphor resin layer 43. This arrangement, is unlike the semiconductor light emitting device 3 (refer to FIG. 6) according to the second embodiment.

The method of manufacturing the semiconductor light emitting device of the third embodiment will be described.

As illustrated in FIG. 8, after forming the semiconductor light emitting device 3 (refer to FIG. 6) according to the second embodiment, the high heat dissipation member 46 (which is formed of silicon carbide, for example) is adhered to the phosphor resin layer 43 by using an adhesive or the like.

Note that, the high heat dissipation member 46 may also be formed of aluminum oxide in some embodiments.

The effects of the exemplary embodiment will be described.

In the semiconductor light emitting device of the third embodiment, the high heat dissipation member 46 has a high thermal conductivity so it is possible to dissipate heat in the phosphor resin layer 43 to the outside via the high heat dissipation member 46.

A configuration, a manufacturing method, and effects of the exemplary embodiment other than the above description are the same as those of the second embodiment.

Fourth Embodiment

A configuration of the semiconductor light emitting device of the fourth embodiment will be described.

Figure 9:
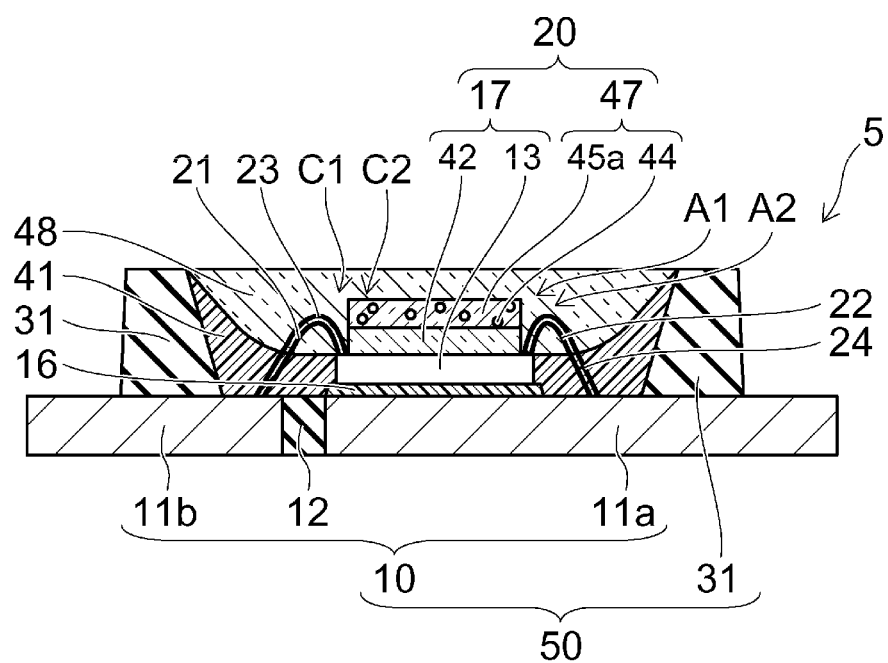
FIG. 9 is a perspective view schematically illustrating a semiconductor light emitting device according to a fourth embodiment.

FIG. 9 is perspective view schematically illustrating a semiconductor light emitting device of the fourth embodiment.

As illustrated in FIG. 9, a semiconductor light emitting device 5 of the fourth embodiment is different from the semiconductor light emitting device 3 (refer to FIG. 6) according to the second embodiment in terms of the following aspects: (a1) a phosphor film 47 is provided on the transparent film 42; (a2) a transparent resin layer 48 is provided in the recessed portion 51. The phosphor film 47 includes a resin 45a and a phosphor 44. In the phosphor film 47, blue light which is emitted from the LED chip 13 is converted into yellow light.

In the semiconductor light emitting device 5 of the fourth embodiment, a chip 20 having a transparent film 42 on the LED chip 13, and the phosphor film 47 on the transparent film 42 is used. A method of forming this chip 20 will be described.

Figure 10A:
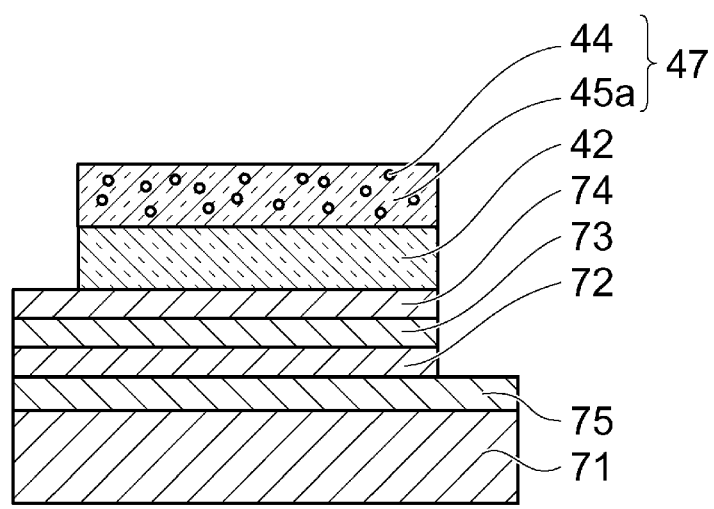
FIGS. 10A and 10B are views schematically illustrating a method of forming a chip of the semiconductor light emitting device according to the fourth embodiment.
Figure 10B:
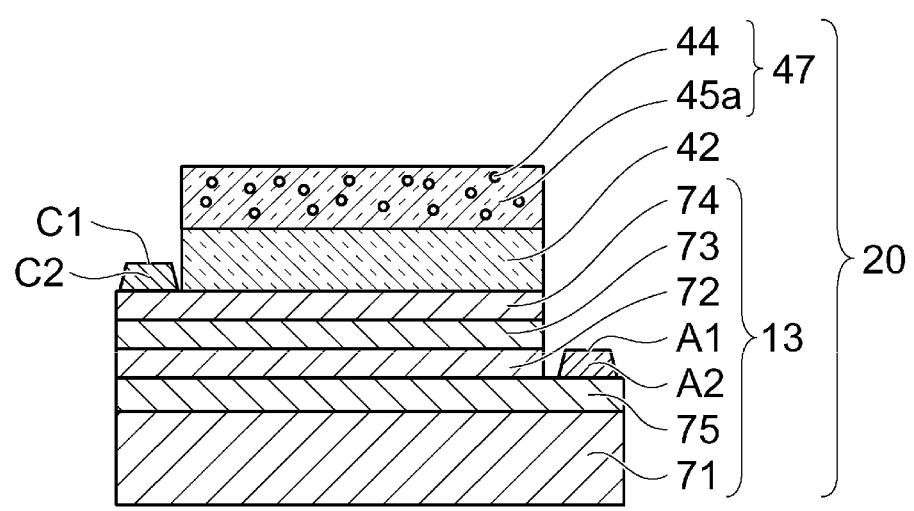

FIGS. 10A and 10B are views schematically illustrating a method of forming a chip of the semiconductor light emitting device of the fourth embodiment.

The manufacturing method is the same as the forming method (refer to FIG. 3C) of the chip 17 used in the semiconductor light emitting device according to the first embodiment up until the transparent film 42 is formed.

As illustrated in FIG. 10A, the phosphor film 47 is formed in such a manner that the transparent film 42 is coated with the phosphor material obtained by mixing the phosphor 44 into the resin 45a. The resin 45a is, for example, a phenyl-based silicone resin. At this time, a portion of the n-type semiconductor layer 74 is exposed or left exposed by not having the transparent film 42 and the phosphor film 47 formed thereon so the cathode electrode C1 and the cathode electrode C2 can be formed on the chip 13.

As illustrated in FIG. 10B, the cathode electrode C1 and the cathode electrode C2 are formed on the n-type semiconductor layer 74. The anode electrode A1 and the anode electrode A2 are formed on an exposed portion of metal layer 75. In this way, the chip 20 is formed.

Figure 11A:
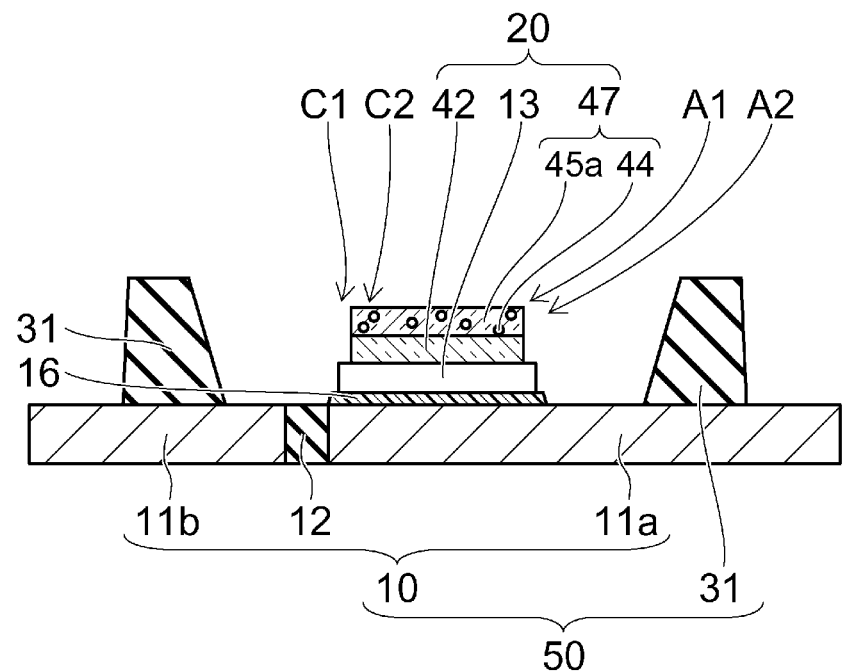
FIGS. 11A and 11B are perspective views schematically illustrating a method of manufacturing the semiconductor light emitting device according to the fourth embodiment.
Figure 11B:
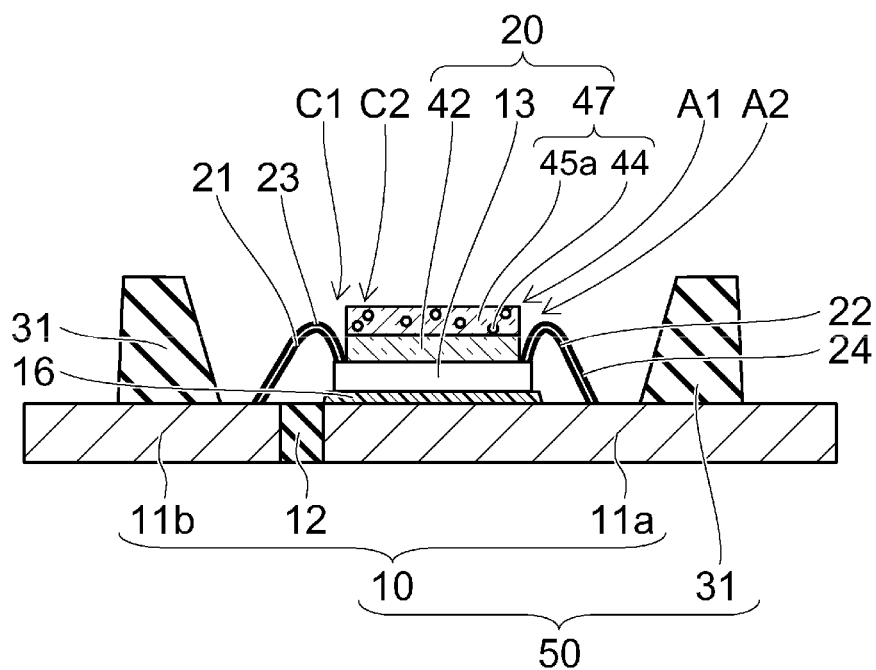

FIGS. 11A and 11B are perspective views schematically illustrating a method of manufacturing the semiconductor light emitting device of the fourth embodiment.

Figure 12:
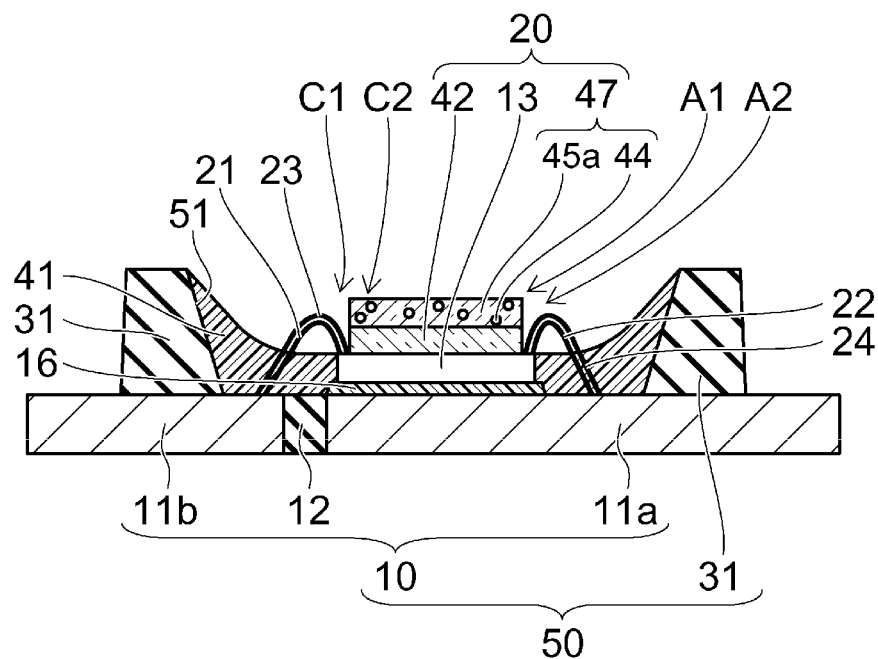
FIG. 12 is a perspective view schematically illustrating a method of manufacturing the semiconductor light emitting device according to the fourth embodiment.

FIG. 12 is a perspective view schematically illustrating a method of manufacturing the semiconductor light emitting device of the fourth embodiment.

The manufacturing method is the same as the manufacturing method (refer to FIG. 4A) of the semiconductor light emitting device according to the second embodiment up until the point the frame is coated with the mounting material 16.

As illustrated in FIG. 11A, the chip 20 is mounted on the mounting material 16. By using the mounting material 16, the chip 20 is adhered and fixed to the case body 50.

As illustrated in FIG. 11B, the cathode electrode C1 and the electrode 11b are connected to each other via the wire 21 through the wire bonding. The anode electrode A1 and the electrode 11a are connected to each other via the wire 22. The cathode electrode C2 and the electrode 11b are connected to each other via the wire 23 (wires 21 & 23 are depicted as overlapping each other in the view direction, but this is not necessarily required). The anode electrode A2 and the electrode 11a are connected to each other via the wire 24 (wires 22 & 24 are depicted as overlapping each other in the view direction, but this is not necessarily required).

As illustrated in FIG. 12, the high reflectance layer 41 is formed in such a manner that a portion of the inside of the recessed portion 51 is filled with a highly reflective material obtained by mixing a fine particle of titanium oxide (or the like) into the resin. It is preferable that the inside of the recessed portion 51 of the case body 50 is not completely filled with the highly reflective material. The highly reflective material (which forms high reflectance layer 41) is disposed in the recess portion 51 to be at a level lower than the transparent film 42 and phosphor film 47, excepting some peripheral portions (e.g., portions along the inclined wall(s) of enclosure 31) of the high reflectance layer 41 can be at a level above the transparent film 42 and the phosphor film 47.

As illustrated in FIG. 9, the transparent resin layer 48 is formed in such a manner that the remaining space inside of the recessed portion 51 is completely filled with, for example, a phenyl-based silicone resin.

In phosphor film 47, the blue light which is emitted from the LED chip 13 is converted into the yellow light. This light conversion is performed in such a manner that the blue light is incident on the phosphor 44 in the phosphor film 47. As a distance the blue light travels through the phosphor film 47 becomes longer, a larger part of the blue light will be incident on the phosphor 44 and consequently converted to yellow light. If the distance that blue light travels through the phosphor film 47 varies according to transmission direction, the total number of the phosphors 44 with which the blue light will interact with is changed, and thus the amount of the blue light to be converted also becomes different. As a result, output light color uniformity will reduced for a light-emitting device and the color of the output light may be uneven across an emission surface. It is generally preferable that the uniformity of color is maintained and thus the color unevenness does not occur when the semiconductor light emitting device is seen from all directions.

In this regard, in the semiconductor light emitting device 5 of the fourth embodiment, the area into which the phosphor 44 is mixed is limited to the phosphor film 47. The phosphor film 47 is relatively small and thin as compared with the phosphor resin layer 43 of the second embodiment. With this, the differences in transmission distance through the phosphor material due to the transmission direction is smaller for a device incorporating a phosphor film 47 (FIG. 9) rather than the phosphor resin layer 43 (FIG. 6). As a result, as compared with the second embodiment, the uniformity of color in the fourth embodiment is maintained and thus the color unevenness does not easily occur.

A configuration, a manufacturing method, and effects of the fourth embodiment other than the above description are the same as those of the first embodiment.

Fifth Embodiment

Figure 13:
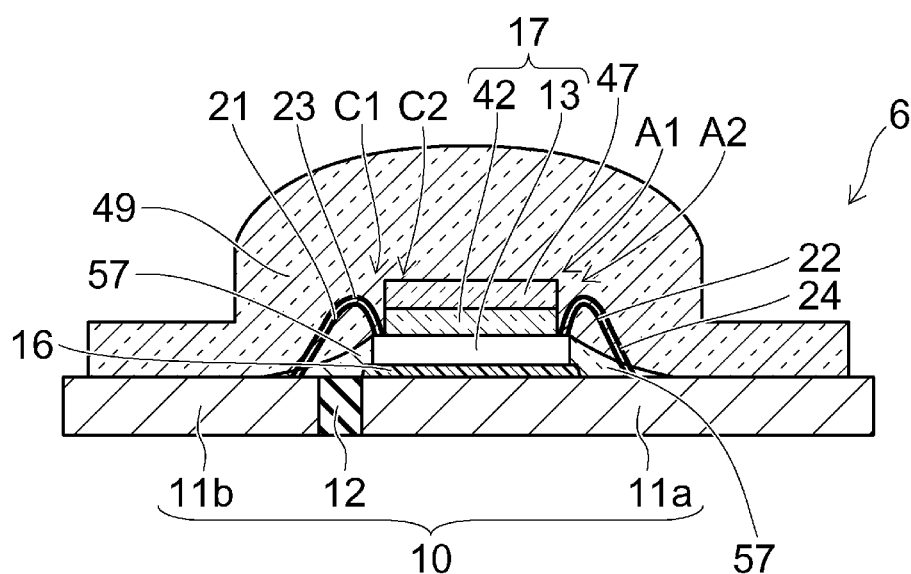
FIG. 13 is a perspective view schematically illustrating a semiconductor light emitting device according to a fifth embodiment.

FIG. 13 is a perspective view schematically illustrating a semiconductor light emitting device according to a fifth embodiment.

As illustrated in FIG. 13, a semiconductor light emitting device 6 of the fifth embodiment is different from the semiconductor light emitting device 1 (refer to FIG. 2B) according to the first embodiment, in terms of the following aspects:

(b1) the phosphor film 47 is provided on the transparent film 42 and comprises a resin material and a phosphor particle 63 deposited on the transparent film 42 (see FIG. 15A));

(b2) a phosphor member 57 is provided on a peripheral part of the chip 17;

(b3) a transparent lens resin 49 is provided on upper surface of the frame 10, the surface of the chip 17, and the surface of the phosphor film 47; and (b4) the phosphor resin layer 43 and the enclosure 31 are not provided.

The transparent lens resin 49 is formed into a dome shape in which a portion above the phosphor film 47 is thicker than surroundings, and is formed of, for example, a phenyl-based silicone resin. The transparent lens resin 49 is formed of a transparent resin, and a projecting portion having a convex lens shape is formed on the upper surface of the chip 17.

A method of manufacturing the semiconductor light emitting device in the fifth embodiment will be described.

Figure 14A:
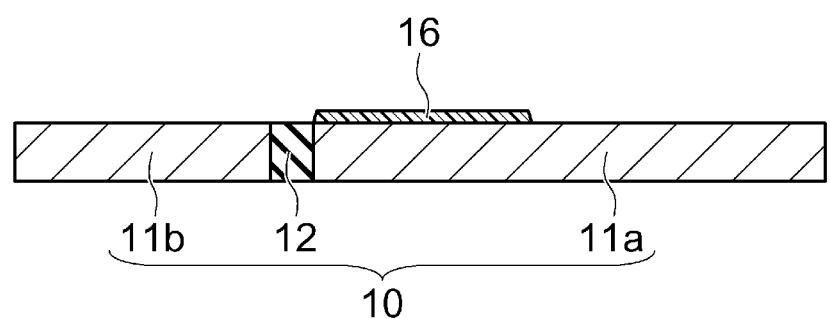
FIGS. 14A and 14B are perspective views schematically illustrating a method of manufacturing the semiconductor light emitting device according to the fifth embodiment.
Figure 14B:
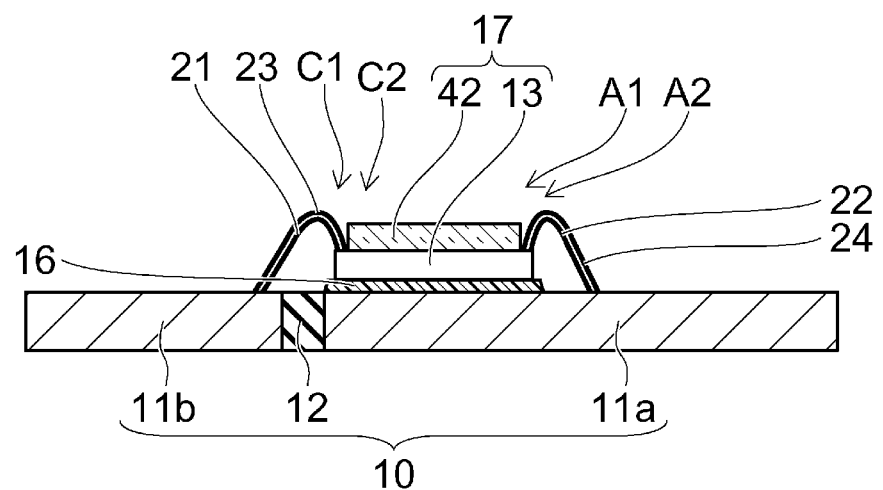

FIGS. 14A and 14B are perspective views schematically illustrating a method of manufacturing the semiconductor light emitting device of the fifth embodiment.

Figure 15A:
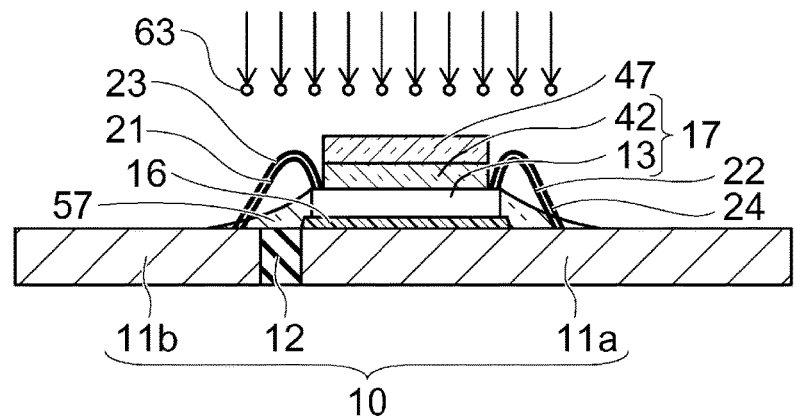
FIGS. 15A and 15B are perspective views schematically illustrating a method of manufacturing the semiconductor light emitting device according to the fifth embodiment.
Figure 15B:
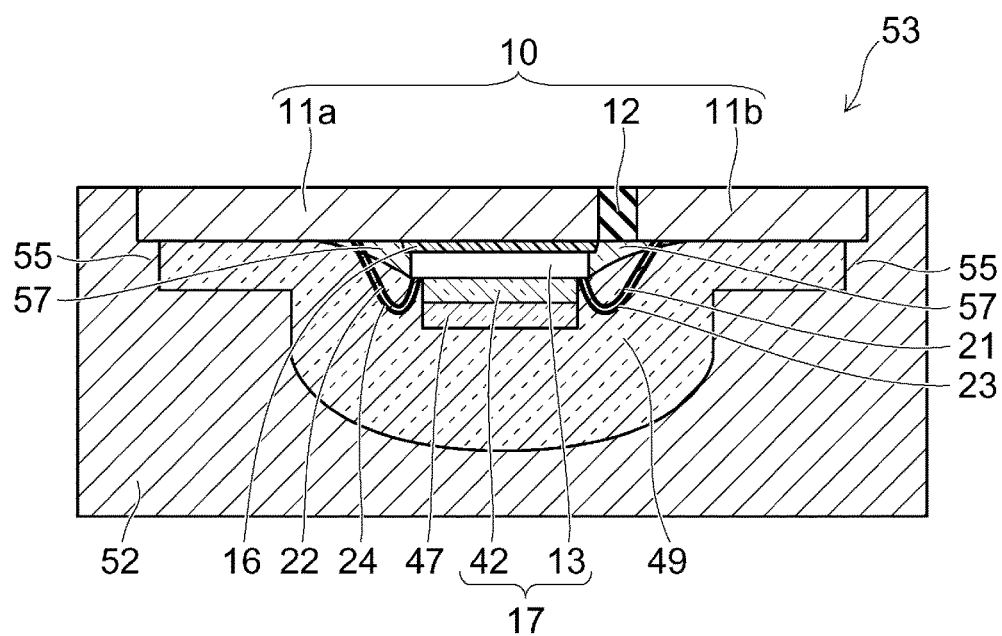

FIGS. 15A and 15B are perspective views schematically illustrating a method of manufacturing the semiconductor light emitting device of the fifth embodiment.

As illustrated in FIG. 14A, a portion on the frame 10 is coated with the mounting material 16. The mounting material 16 is an adhesive.

As illustrated in FIG. 14B, the chip 17 is mounted on the mounting material 16. The chip 17 is adhered, and fixed to the frame 10 via the mounting material 16. The cathode electrode C1 and the electrode 11b are connected to each other via the wire 21. The anode electrode A1 and the electrode 11a are connected to each other via the wire 22. The cathode electrode C2 and the electrode 11b are connected to each other via the wire 23 (wires 21 & 23 are depicted as overlapping each other in the view direction, but this is not necessarily required). The anode electrode A2 and the electrode 11a are connected to each other via the wire 24 (wires 22 & 24 are depicted as overlapping each other in the view direction, but this is not necessarily required).

As illustrated in FIG. 15A, the phosphor film 47 is formed on the chip 17 by spraying the phosphor particles 63 onto the chip 17. At this time, the phosphor particles 63 are also sprayed in the vicinity of the chip 17 so as to form the phosphor member 57. A structure including the frame 10, the chip 17, the phosphor film 47, and the phosphor member 57 is collectively referred to as a structure 53.

As illustrated in FIG. 15B, the structure 53 is turned upside down, and then is put into a mold 52. At this time, the frame 10 comes in contact with a stopper 55 of the mold 52 such that the structure 53 is not excessively put into the mold 52. The stopper 55 may be, for example, a rim or a ledge structure on some or all the mold 52 interior surface which prevents the structure 53 from contacting the dome-shaped surface of mold 52. The inside of the mold 52 is filled with a transparent lens resin material and transparent lens resin 49 is formed by solidifying the transparent lens resin material. The structure 53 is extracted from the mold 52.

In the semiconductor light emitting device 6 of the fifth embodiment, the phosphor film 47 is provided on the chip 17 in a manner similar to the case of the semiconductor light emitting device 5 (refer to FIG. 9) according to the fourth embodiment. The phosphor film. 47 in both instances is thinner than the phosphor resin layer 43 of the first embodiment. Accordingly, as compared with the first embodiment, the uniformity of color is similarly maintained in the fourth and fifth embodiments and thus the color unevenness is reduced in these embodiments.

In addition, distribution properties of the light which is emitted from the LED chip 13 are improved by providing the transparent lens resin 49.

A configuration, a manufacturing method, and effects of the fifth embodiment other than the above description are the same as those of the first embodiment.

Sixth Embodiment

A semiconductor light emitting device 7 of the sixth embodiment will be described.

Figure 16:
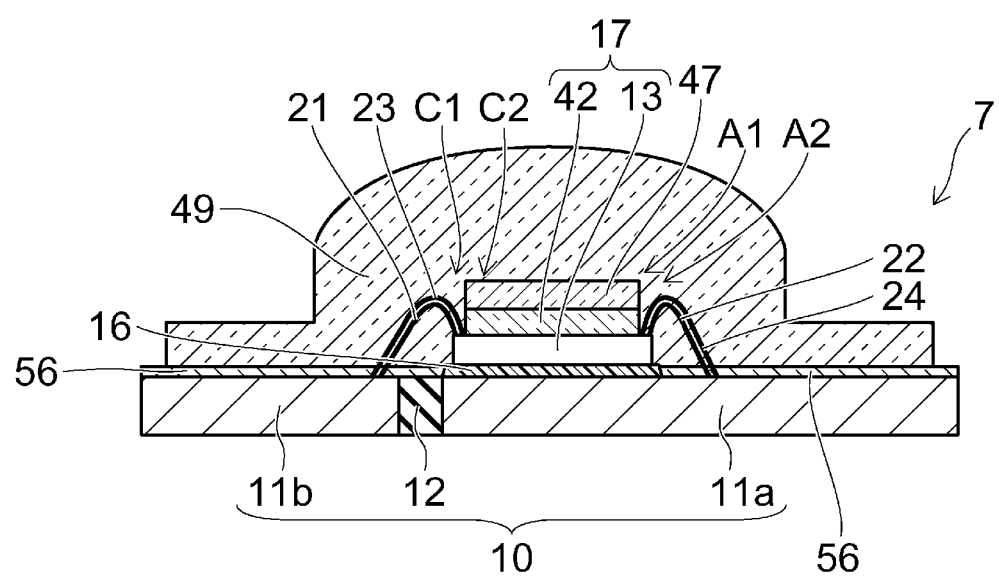
FIG. 16 is a perspective view schematically illustrating a semiconductor light emitting device according to a sixth embodiment.

FIG. 16 is a perspective view schematically illustrating a semiconductor light emitting device of the sixth embodiment.

As illustrated in FIG. 16, the semiconductor light emitting device 7 of the sixth embodiment is different from the semiconductor light emitting device 6 (refer to FIG. 13) according to the fifth embodiment in terms of the following aspects:

(c1) a high reflection resin layer 56 is provided on the upper surface of the frame 10 of an area other than the area on which the LED chip 13; and (c2) the phosphor member 57 is not provided.

A method of manufacturing the semiconductor light emitting device of the sixth embodiment will be described.

Figure 17A:
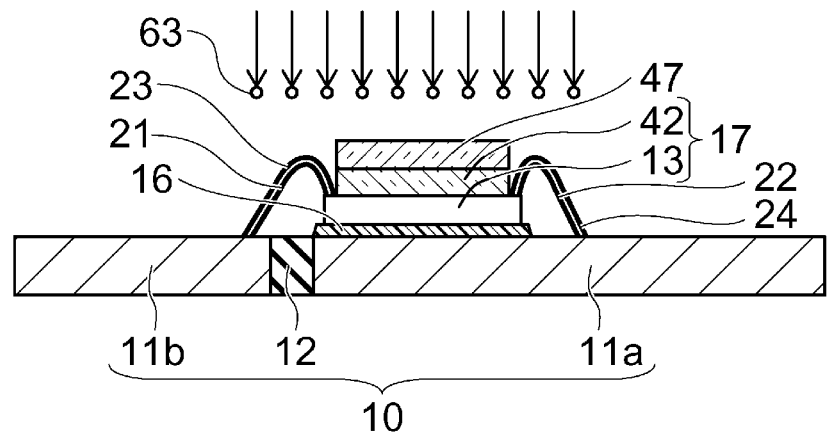
FIGS. 17A and 17B are perspective views schematically illustrating a method of manufacturing the semiconductor light emitting device according to the sixth embodiment.
Figure 17B:
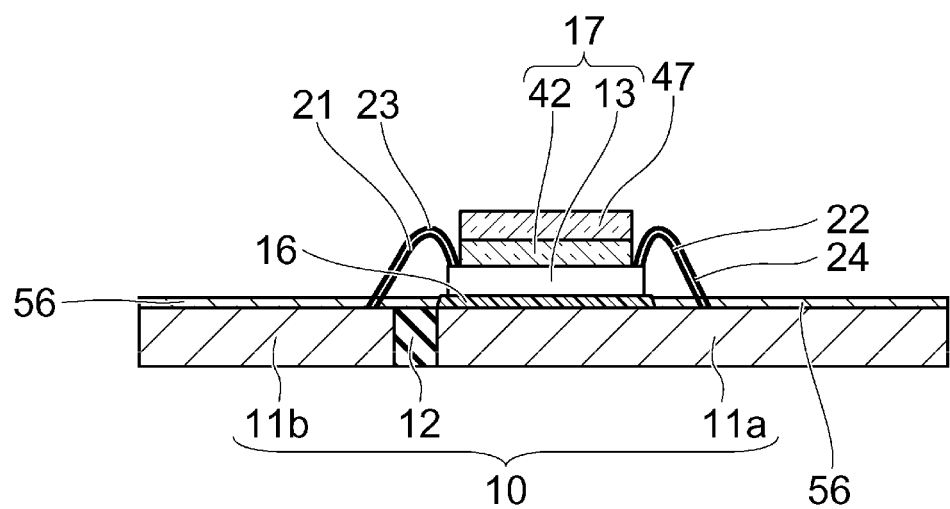

FIGS. 17A and 17B are perspective views schematically illustrating a method of manufacturing a semiconductor light emitting device of the sixth embodiment.

The manufacturing method is the same as the manufacturing method (refer to FIG. 14B) of the semiconductor light emitting device according to the fifth embodiment up until the wires 21 to 24 are formed.

As illustrated in FIG. 17A, the phosphor film 47 is formed on the chip 17 by spraying the phosphor particles 63 on the chip 17. At this time, the periphery of the chip 17 is masked (not shown) such that the phosphor particles 63 are not sprayed on areas outside of the chip 17 area. (Compare with the formation of element 57 in FIG. 15A)

As illustrated in FIG. 17B, the high reflectance resin layer 56 is formed in such a manner that the frame 10 is coated with a film having a substantially uniform thickness and comprised of a highly reflective material obtained by mixing the titanium oxide into a resin. At this time, it is preferable that the upper surface of the frame 10 is coated with the highly reflective material but is not coated to a thickness such that the upper surface of the high reflectance resin layer 56 is above portion the lower surface of the chip 17.

A forming method of the transparent lens resin 49 is the same as the manufacturing method of the semiconductor light emitting device (refer to FIG. 15B) according to the fifth embodiment.

With the high reflectance resin layer 56 formed as illustrated in FIG. 16, it is possible to emit at least a portion of the light that is reflected at the interface between the transparent lens resin 49 and the outside to the outside by reflection (off high reflectance resin layer 56) again. As a result, the light extraction efficiency becomes higher in the sixth embodiment than that in the fifth embodiment.

A configuration, a manufacturing method, and effects of the sixth embodiment other than the above description are the same as those of the fifth embodiment.

Seventh Embodiment

Figure 18:
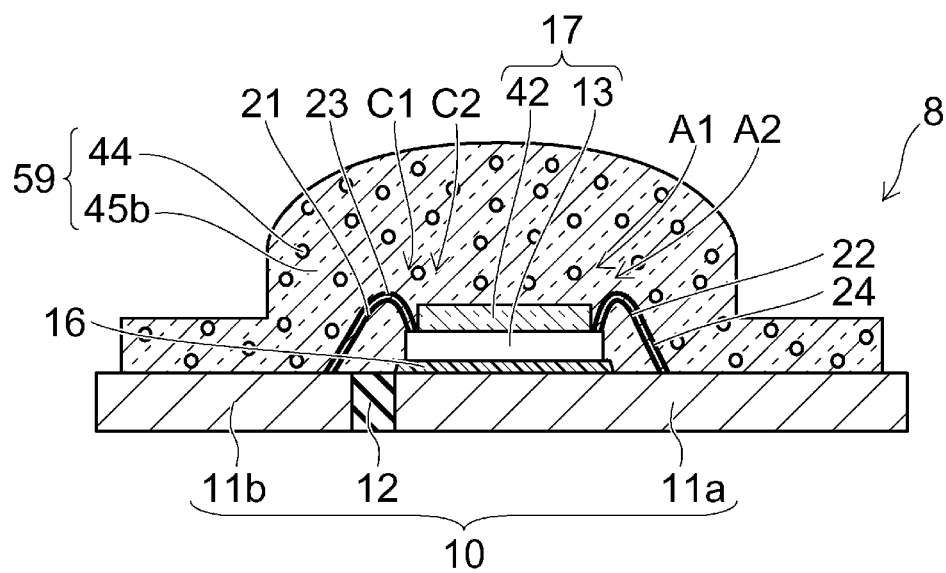
FIG. 18 is a perspective view schematically illustrating the semiconductor light emitting device according to a seventh embodiment.

FIG. 18 is a perspective view schematically illustrating the semiconductor light emitting device 8 of the seventh embodiment.

As illustrated in FIG. 18, a semiconductor light emitting device 8 of the seventh embodiment is different from the semiconductor light emitting device 6 (refer to FIG. 13) according to the fifth embodiment in terms of the following aspects:

(d1) a phosphor lens resin 59 is provided on the upper surface of the frame 10, the side surface of the LED chip 13, and the surface of the transparent film 42; and (d2) the phosphor film 47, the phosphor member 57, and the transparent lens resin 49 are not provided (see FIG. 13).

The phosphor lens resin 59 is formed by mixing the phosphor 44 into the material used to form the transparent lens resin 49 (see e.g., FIG. 13). The phosphor lens resin 59 is formed of a material in which the phosphor 44 is dispersed in a transparent resin 45b, and a projection portion having a convex lens shape is formed on the upper surface. The phosphor lens resin 59 includes the transparent resin 45b and the phosphor 44.

Figure 19:
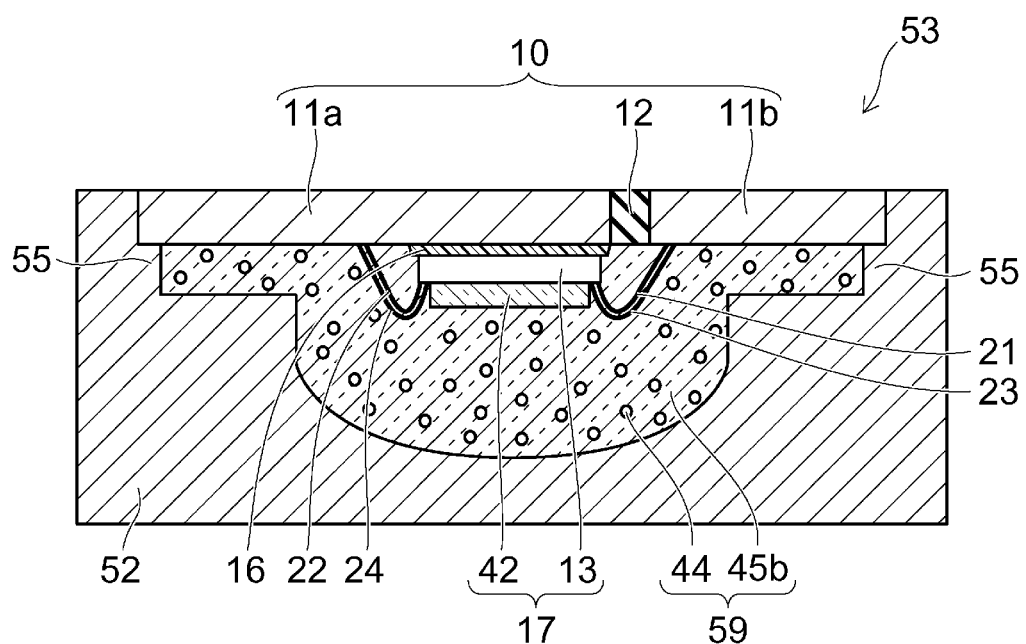
FIG. 19 is a perspective view schematically illustrating the method of manufacturing the semiconductor light emitting device according to the seventh embodiment.

FIG. 19 is a perspective view schematically illustrating the method of manufacturing a semiconductor light emitting device of the seventh embodiment.

The manufacturing method is the same as the manufacturing method (refer to FIG. 14B) of the semiconductor light emitting device according to the fifth embodiment up until the wires 21 to 24 are formed through the wire bonding.

As illustrated in FIG. 19, a structure 53 is turned upside down, and then is put into a mold 52. The mold 52 is filled with the phosphor lens resin material. The phosphor lens resin material is a material in which the phosphor 44 is mixed in the transparent resin 45b. The transparent resin 45b is, for example, a phenyl-based silicone resin. The phosphor lens resin 59 and the semiconductor light emitting device 8 are formed by solidifying the phosphor lens resin material.

A configuration, a manufacturing method, and effects of the seventh embodiment other than the above description are the same as those of the fifth embodiment.

As illustrated in FIG. 2B, the semiconductor light emitting device 1 according to the first embodiment includes the first electrode 11a, the LED chip 13 (a light emitting semiconductor chip), the transparent film 42, and the phosphor resin layer 43. The LED chip 13 is provided on the first electrode 11a.

As illustrated in FIG. 3D, the LED chip 13 includes the p-type semiconductor layer 72, the light emitting layer 73, and the n-type semiconductor layer 74. The transparent film 42 is provided on the n-type semiconductor layer 74. For example, the transparent film 42 comes in to direct contact with the n-type semiconductor layer 74. In some embodiments, a dielectric film (for example, a passivation film which includes silicon oxide or the like) may be provided on the upper surface of the n-type semiconductor layer 74. In such embodiments, the transparent film 42 may be provided on the dielectric film rather than directly contacting the n-type semiconductor layer 74. In some embodiments, another semiconductor layer may be disposed on the n-type semiconductor layer 74 and the transparent film 42 may be provided directly on this other semiconductor layer instead of n-type semiconductor layer 74. The phosphor resin layer 43 is provided on the transparent film 42. The phosphor resin layer 43 includes the resin 45 and the phosphor 44.

Here, the refractive index of the transparent film 42 is higher than the refractive index of the layer with which it is in direct contact (for example, the n-type semiconductor layer 74 or the dielectric layer).

The semiconductor layer (for example, the n-type semiconductor layer 74) includes, for example, a nitride semiconductor material. The chemical formula of $B_x In_y Al_z Ga_{1-x-y-z} N$ ($0 \leq x \leq 1$, $0 \leq y \leq 1$, $0 \leq z \leq 1$, $x+y+z \leq 1$), corresponds to possible nitride semiconductor material compositions obtained by varying the composition ratio x, y, and z. As used herein "a nitride semiconductor material" also includes materials comprising a Group V element other than N (nitrogen). Similarly, as used herein "a nitride semiconductor material" includes materials meeting the above chemical formula that may further including various elements (e.g., dopants) added so as to control various physical properties such as a conductivity type. Likewise, as used herein "a nitride semiconductor material" includes materials meeting the above chemical formula which may also include intentional dopants or not and in addition to impurities or trace elements or the like included unintentionally in materials otherwise meeting corresponding to the above chemical formula.

The semiconductor layer (for example, the n-type semiconductor layer 74) includes, for example, gallium nitride (GaN). The refractive index of gallium nitride is, for example, about 2.4.

The transparent film 42 may include at least any one of silicon carbide (SiC), titanium oxide ($TiO_2$), and gallium phosphide (GaP), for example. The refractive index of silicon carbide is, for example, 2.64. The titanium oxide may be, for example, a rutile single crystal. The refractive index of titanium oxide is, for example, about 2.72 when the titanium oxide a rutile single crystal. The refractive index of gallium phosphide is, for example, about 3.3.

The refractive index of the transparent film 42 is higher than the refractive index of the semiconductor layer (for example, the n-type semiconductor layer 74). It is possible to prevent the light emitted from the LED chip 13 (the light emitting layer 73) from being internally reflected at the interface between the semiconductor layer and the transparent film 42.

The thermal conductivity of the titanium oxide material is about 6 W/mK. The thermal conductivity of the gallium phosphide material is about 77 W/mK. On the other hand, the thermal conductivity of the phosphor resin layer 43 is, for example, 0.200 W/mK. The thermal conductivity of the titanium oxide, and the thermal conductivity of the gallium phosphide are thus, in general, higher than the thermal conductivity of the phosphor resin layer 43. It is therefore possible to dissipate the heat generated in the phosphor resin layer 43 to the LED chip 13.

The conductivity state of the semiconductor layer is optional. For example, the semiconductor layer may be the n-type semiconductor layer 74 or a different layer. The impurity concentration of the semiconductor layer may be equal to or lower than $1 \times 10^{-17}$ cm$^{-3}$. When the LED chip 13 includes the p-type semiconductor layer 72, the light emitting layer 73, and the n-type semiconductor layer 74, then another semiconductor layer can be provided between the n-type semiconductor layer 74 and the transparent film 42, and this semiconductor layer may come in contact with the transparent film 42. When the n-type semiconductor layer 74 includes GaN, the semiconductor layer may include at least any one of AlN and AlGaN, for example.

As illustrated in FIG. 6, in the exemplary embodiment, the semiconductor light emitting device 3 further includes a second electrode 11b and a reflection layer (a high reflectance layer 41) in addition to the first electrode 11a, the LED chip 13, the transparent film 42, and the phosphor resin layer 43. The second electrode 11b is separated from the first electrode ha in a direction orthogonal to a first direction (layer stacking direction) from the first electrode 11a to the transparent film 42. The phosphor resin layer 43 includes a part which does not overlap the light emitting semiconductor chip (the LED chip 13) in the first direction. The reflection layer (the high reflectance layer 41) is provided between a portion of the non-overlapping part of the phosphor resin layer 43, and the first electrode 11a, and also between the non-overlapping part of the phosphor resin layer 43, and the second electrode 11b. That is, as depicted in FIG. 6, the high reflectance layer 41 is disposed around the periphery of the LED chip 13 below portions of the phosphor resin layer 43 which are not directly above the LED chip 13.

For example, in the peak wavelength of the light emitted from the light emitting layer 73, the reflectivity of the reflection layer (the high reflectance layer 41) is higher than, for example, the reflectivity of the wires (wires 21 to 24) making connections between the LED chip 13 and the first electrode 11a or the second electrode 11b. The reflectivity of the reflection layer (the high reflectance layer 41) is also higher than, for example, the reflectivity (at the peak emission wavelength) of the enclosure 31. If the reflection layer (the high reflectance layer 41) is not provided, light would be incident on the wires or the enclosure 31 and thus a light loss would occur due to the lower reflectivity of these materials as compared to the reflection layer (high reflectance layer 41). It is possible to efficiently extract the light by providing the reflection layer (the high reflectance layer 41). The reflection layer (high reflectance layer 41) includes, for example, titanium oxide ($TiO_2$) particles.

As illustrated in FIG. 8, in the third embodiment, the semiconductor light emitting device 4 further includes a heat dissipation member 46 in addition to the first electrode 11a, the LED chip 13 (light emitting semiconductor chip), the transparent film 42, and the phosphor resin layer 43. The heat dissipation member 46 is provided on the phosphor resin layer 43. The thermal conductivity of the heat dissipation member 46 is higher than the thermal conductivity of the phosphor resin layer 43. The heat dissipation member 46 may be aluminum oxide, for example. The thermal conductivity of the aluminum oxide is, for example, 30 W/mK. The heat in the phosphor resin layer 43 can be dissipated to the outside via the heat dissipation member 46.

As illustrated in FIG. 9, in the fourth embodiment, the semiconductor light emitting device 5 further includes the second electrode 11b, the reflection layer (the high reflectance layer 41), and the transparent resin layer 48 in addition to the first electrode 11a, the LED chip 13, the transparent film 42, and the phosphor resin layer 43. The second electrode 11b is separated from the first electrode 11a. The transparent resin layer 48 is provided on the phosphor resin layer 43.

The transparent resin layer 48 includes a part which does not overlap the light emitting semiconductor chip (the LED chip 13) in the first direction. The reflection layer (the high reflectance layer 41) is provided between a portion of the non-overlapping part of the transparent resin layer 48, and the first electrode 11a, and also between the non-overlapping part of the transparent resin layer 48, and the second electrode 11b. That is, as depicted in FIG. 9, the high reflectance layer 41 is disposed around the periphery of the LED chip 13 below portions of the transparent resin layer 48 which are not directly above the LED chip 13.

As illustrated in FIG. 13, in the fifth embodiment, the semiconductor light emitting device 6 further includes the second electrode 11b, and the transparent lens resin 49 in addition to the first electrode 11a, the LED chip 13, the transparent film 42, and the phosphor resin layer (phosphor film 47). The transparent lens resin 49 is provided on the first electrode 11a, the second electrode 11b, the side surface of the light emitting semiconductor chip (the LED chip 13), the side surface of the transparent film 42, and surfaces (for example, the upper surface and the side surface) of the phosphor resin layer (the phosphor film 47). The side surface of the light emitting semiconductor chip (the LED chip 13), the side surface of the transparent film 42, and the side surface of the phosphor resin layer (the phosphor film 47) intersect with the direction perpendicular to the first direction.

The transparent lens resin 49 includes a part which does not overlap the light emitting semiconductor chip (the LED chip 13) in the first direction. The upper surface of the transparent lens resin 49 is formed into a convex lens shape. The transparent lens resin 49 includes, for example, a phenyl-based silicone resin.

The transparent lens resin 49 may further include another part which overlaps the light emitting semiconductor chip (the LED chip 13) in the first direction. Here, for example, the thickness of the part of the transparent lens resin 49 which does not overlap the light emitting semiconductor chip in the first direction is smaller than the thickness of the part which overlaps the light emitting semiconductor chip of the transparent lens resin 49 in the first direction.

As illustrated in FIG. 16, in the sixth embodiment, the semiconductor light emitting device 7 further includes the reflection resin layer 56 (the high reflectance resin layer 56) in addition to the first electrode 11a, the LED chip 13, the transparent film 42, and the phosphor resin layer (the phosphor film 47). The reflection resin layer (the high reflection resin layer 56) is provided between a portion of the part, which does not overlap the light emitting semiconductor chip, of the transparent resin layer 49, and the first electrode 11a, and another portion of the part, which does not overlap the light emitting semiconductor chip, of the transparent resin layer 49, and the second electrode 11b. The reflection layer 56 (the high reflectance layer 56) includes, for example, titanium oxide.

As illustrated in FIG. 18, in the seventh embodiment, the semiconductor light emitting device 8 further includes the second electrode 11b in addition to the first electrode 11a, the LED chip 13 (the light emitting semiconductor chip), the transparent film 42, and the phosphor resin layer (phosphor film 47). The phosphor resin layer (the phosphor film 47) includes a part which does not overlap the LED chip 13 in the first direction and a part which does overlap the LED chip 13 in the first direction. The thickness (in the first direction) of the part of the phosphor film 47 which does not overlap the light emitting semiconductor chip is smaller than the thickness (in the first direction) of the portion of the phosphor film 47 which does overlap the light emitting semiconductor chip.

As described above, according to the above embodiments, it is possible to provide the semiconductor light emitting device which improves the light extraction efficiency.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed:

1. A semiconductor light emitting device, comprising:
   a light emitting chip having a semiconductor layer at a first surface of the light emitting chip;
   a transparent film on the first surface and forming an interface with the semiconductor layer;
   a phosphor resin layer including a resin and a phosphor, on the transparent film;
   a first electrode having an upper surface on which the light emitting chip is disposed;
   a second electrode having an upper surface and being spaced from the first electrode in a direction parallel to the upper surface of the first electrode; and
   a reflection layer provided on the upper surfaces of the first and second electrodes, wherein
   a refractive index of the transparent film is greater than a refractive index of the semiconductor layer.

2. The device according to claim 1, wherein the transparent film comprises at least one of silicon carbide, titanium oxide, and gallium phosphide.

3. The device according to claim 2, wherein
   the phosphor resin layer includes a first portion above the light emitting chip along a first direction that is orthogonal to the upper surface of the first electrode and a second portion above the first and second electrodes along the first direction and not above the light emitting chip along the first direction.

4. The device according to claim 3, wherein the reflection layer includes titanium oxide.

5. The device according to claim 1, wherein
   the phosphor resin layer includes a first portion above the light emitting chip along a first direction that is orthogonal to the upper surface of the first electrode and a second portion above the first and second electrodes along the first direction and not above the light emitting chip along the first direction.

6. The device according to claim 5, wherein the reflection layer includes titanium oxide.

7. The device according to claim 1, further comprising:
   a heat dissipation member on the phosphor resin layer, wherein a thermal conductivity of the heat dissipation member is higher than a thermal conductivity of the phosphor resin layer.

8. The device according to claim 1, further comprising:
   a transparent resin layer on the phosphor resin layer and including a first portion that is not above the light emitting chip along a first direction orthogonal to the first surface, wherein
   the reflection layer is between the first portion of the transparent resin layer and the upper surfaces of the first and second electrodes.

9. The device according to claim 1, further comprising:
   a lens resin on the upper surfaces of the first and second electrodes, a side surface of the light emitting chip, a side surface of the transparent film, and an upper surface and a side surface of the phosphor resin layer, wherein
   the lens resin includes a first portion which is not above the light emitting chip along the first direction, and
   an upper surface of the lens resin includes a convex lens shape.

10. The device according to claim 9, wherein the lens resin comprises a silicone resin.

11. The device according to claim 9, wherein a thickness along the first direction of the first portion of the lens resin is smaller than a thickness along the first direction of a second portion of the lens resin that is above the light emitting chip in the first direction.

12. The device according to claim 9, further comprising:
   a reflection resin layer that includes titanium oxide ($TiO_2$) particles, the reflection resin layer being between the first portion of the lens resin and the upper surfaces of the first and second electrodes along the first direction.

13. The device according to claim 1,
the phosphor resin layer includes a first portion which is not above the light emitting chip along the first direction and a second portion which above the light emitting chip along the first direction, and
a thickness of the first portion of the phosphor resin layer along the first direction is smaller than a thickness of the second portion of the phosphor resin layer along the first direction.

14. The device according to claim 1, wherein the transparent film is a rutile single crystal film.

15. The device according to claim 1, wherein
a first terminal of the light emitting chip is electrically connected to the first electrode via a first bonding wire,
a second terminal of the light emitting chip is electrically connected to the second electrode via a second bonding wire, and
the light emitting chip is disposed in an enclosure having an angled interior sidewall, the enclosure being disposed on the first and second electrodes and surrounding the first and second bonding wires and the light emitting chip in a plane parallel to the first surface.

16. A light emitting device, comprising:
a light emitting laminated body comprising a plurality of layers including a light emitting layer, the plurality of layers stacked one on the other along a first direction orthogonal a layer plane of the light emitting laminated body;
a first terminal disposed on a first layer in the plurality of layers, the first layer being below the light emitting layer along the first direction;
a second terminal disposed on a second layer in the plurality of layers, the second layer being above the light emitting layer along the first direction;
a transparent film disposed on an upper surface of an uppermost one of the layers in the plurality of layers;
a first electrode having an upper surface on which the light emitting laminated body is disposed;
a second electrode having an upper surface and being spaced from the first electrode in a direction parallel to the upper surface of the first electrode; and
a reflection layer provided on the upper surfaces of the first and second electrodes, wherein a refractive index of the transparent film is greater than a refractive index of the uppermost one of the layers in the plurality of layers.

17. The light emitting device according to claim 16, wherein the second layer is the uppermost one of the layers in the plurality of layers.

18. The light emitting device according to claim 16, wherein the first and second terminals are both on an upper surface side of the light emitting laminated body.

* * * * *